(12) United States Patent
Asai et al.

(10) Patent No.: US 9,971,242 B2
(45) Date of Patent: May 15, 2018

(54) PHOTO-CURABLE RESIN COMPOSITION AND PHOTO-CURABLE DRY FILM USING THE SAME

(71) Applicant: SHIN-ETSU CHEMICAL CO., LTD., Tokyo (JP)

(72) Inventors: Satoshi Asai, Maebashi (JP); Kyoko Soga, Annaka (JP); Hideto Kato, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days. days.

(21) Appl. No.: 15/163,307

(22) Filed: May 24, 2016

(65) Prior Publication Data

US 2016/0357105 A1 Dec. 8, 2016

(30) Foreign Application Priority Data

Jun. 8, 2015 (JP) ................................. 2015-116042

(51) Int. Cl.
| G03F 7/075 | (2006.01) |
| G03F 7/038 | (2006.01) |
| C08K 5/00 | (2006.01) |
| C08K 5/13 | (2006.01) |

(Continued)

(52) U.S. Cl.
CPC .......... G03F 7/0757 (2013.01); C08K 5/0025 (2013.01); C08K 5/13 (2013.01); C09D 183/14 (2013.01); G03F 7/038 (2013.01); C08G 77/52 (2013.01)

(58) Field of Classification Search
CPC .................................................... G03F 7/0757
See application file for complete search history.

(56) References Cited

U.S. PATENT DOCUMENTS

| 3,159,601 A | 12/1964 | Ashby et al. |
| 3,159,662 A | 12/1964 | Ashby et al. |
| 3,220,972 A | 11/1965 | Lamoreaux et al. |

(Continued)

FOREIGN PATENT DOCUMENTS

| EP | 2 305 754 A1 | 4/2011 |
| EP | 2 980 172 A1 | 2/2016 |

(Continued)

OTHER PUBLICATIONS

English translation of JP 2016030791 a (2016) from machine translation from AIPN Japan Patent Office National Center for Industrial Property Information and Training, generated Oct. 16, 2017, 67 pages.*

Sep. 2, 2016 Search Report issued in European Patent Application No. 16001293.6.
Feb. 27, 2018 Office Action issued in Japanese Application No. 2015-116042.

*Primary Examiner* — Cynthia Hamilton
(74) *Attorney, Agent, or Firm* — Oliff PLC

(57) ABSTRACT

The present invention is a photo-curable resin composition containing (A) a silicone polymer compound having repeating units shown by the formulae (1) and (2), (B) a photosensitive acid generator capable of generating an acid by decomposition with light having a wavelength of 190 to 500 nm, (C) one or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group, and (D) one or more compounds selected from polyhydric phenols having 3 or more hydroxyl groups. As a result, there is provided a photo-curable resin composition that can facilitate thick and fine patterning when the composition is used in patterning.

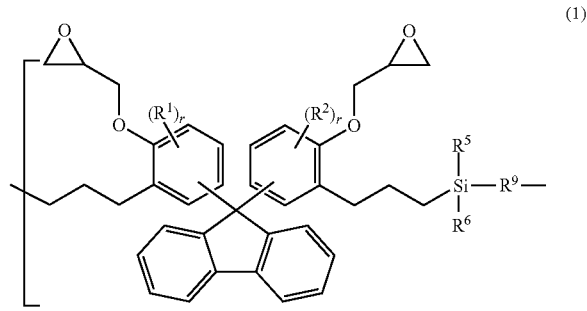

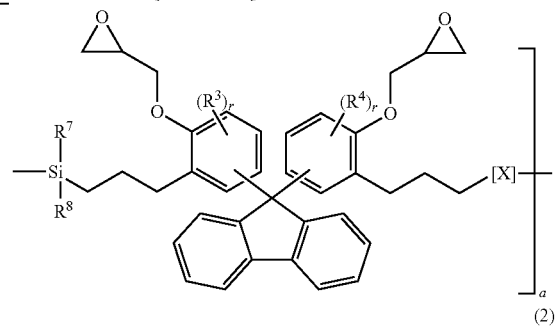

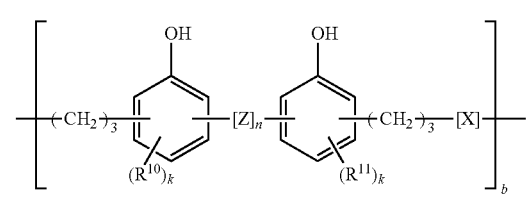

5 Claims, No Drawings

(51) Int. Cl.
*C09D 183/14* (2006.01)
*C08G 77/52* (2006.01)

(56) References Cited

U.S. PATENT DOCUMENTS

| | | | |
|---|---|---|---|
| 3,775,452 | A | 11/1973 | Karstedt et al. |
| 9,377,689 | B2 * | 6/2016 | Takemura ............... C07C 39/21 |
| 2008/0182087 | A1 | 7/2008 | Kato et al. |
| 2009/0215222 | A1 | 8/2009 | Arai et al. |
| 2011/0143092 | A1 | 6/2011 | Asai et al. |
| 2013/0149493 | A1 | 6/2013 | Takemura et al. |
| 2013/0149645 | A1 | 6/2013 | Takemura et al. |
| 2013/0323631 | A1 * | 12/2013 | Asai ..................... G03F 7/0041 430/18 |

FOREIGN PATENT DOCUMENTS

| | | |
|---|---|---|
| JP | 2008-184571 A | 8/2008 |
| JP | 2009-200315 A | 9/2009 |
| JP | 2011-145664 A | 7/2011 |
| JP | 2013-124479 A | 6/2013 |
| JP | 2013-140338 A | 7/2013 |
| JP | 2016030791 A * | 3/2016 |

* cited by examiner

PHOTO-CURABLE RESIN COMPOSITION AND PHOTO-CURABLE DRY FILM USING THE SAME

TECHNICAL FIELD

The present invention relates to a photo-curable resin composition and a photo-curable dry film using the same.

BACKGROUND ART

As various electronic devices including a personal computer, a digital camera, and a mobile phone progress toward downsizing and higher performance, requirements are rapidly increasing for further downsizing, thinning, and higher density in a semiconductor device. Accordingly, it is desired to develop a photosensitive insulating material that can accommodate not only an increase in surface area of a substrate for the sake of higher productivity, but also a structure having fine concavity and convexity with high aspect ratio on a substrate, in high density mounting technologies including a chip size package or a chip scale package (CSP) and a three-dimensional lamination.

As the photosensitive insulating material, there has been proposed a photo-curable resin composition that can be applied with a wide range of film thickness by a spin coating method, which is commonly used in the semiconductor device fabrication, be processed into a fine pattern with a wide range of wavelength, and be post-cured at low temperature into a top coat having excellent flexibility, heat resistance, electric characteristics, adhesiveness, reliability, and chemical resistance to protect electric and electronic parts (PATENT LITERATURE 1). The spin coating method has an advantage of easily forming a film on a substrate.

The photo-curable resin composition for forming a top coat to protect electric and electronic parts is used with a film thickness of 1 to 100 μm on a substrate. Unfortunately, the photo-curable resin composition has a practical limit of forming a film by the spin coating method due to an increase in viscosity when film thickness exceeds about 30 μm.

Additionally, when the photo-curable resin composition is applied onto a substrate having an uneven surface by the spin coating method, the composition is difficult to coat the substrate uniformly. This easily causes the photo-curable resin layer to have voids on an uneven portion of the substrate. It would therefore be desirable to improve planarity and step coverage. As the alternative coating method of the spin coating method, a spray coating method has been proposed (PATENT LITERATURE 2). However, in principle, this method easily causes defects such as height difference due to unevenness of the substrate, film loss at pattern edge, and a pinhole in a recess bottom. Thus, the problems of planarity and step coverage still remain unsolved.

The recent high density mounting technologies including a chip size package or a chip scale package (CSP) and a three-dimensional lamination have strongly desired a material that allows forming a pattern of an ultrathick film exceeding 100 μm on a substrate and covering the pattern with metal such as copper for redistribution from a chip. To obtain a fine pattern, lithography is commonly used. Above all, a chemically amplified negative resist material is suitable to obtain a fine pattern. The pattern used for redistribution exists between device chips permanently and is required to function as a top coat that is curable and excellent in flexibility, heat resistance, electric characteristics, adhesiveness, reliability, and chemical resistance to protect electric and electronic parts. Thus, the resist composition for providing the pattern is preferably of a negative type.

CITATION LIST

Patent Literature

PATENT LITERATURE 1: Japanese Patent Laid-Open Publication No. 2008-184571

PATENT LITERATURE 2: Japanese Patent Laid-Open Publication No. 2009-200315

SUMMARY OF THE INVENTION

Technical Problem

The present invention was accomplished in view of the above problems, and has an object to provide a photo-curable resin composition and a photo-curable dry film using the same that can facilitate thick and fine patterning when these materials are used in patterning.

Solution to Problem

To achieve the object, the present invention provides a photo-curable resin composition, comprising:

(A) a silicone polymer compound having an epoxy group-containing repeating unit shown by the following general formula (1) and a phenolic hydroxyl group-containing repeating unit shown by the following general formula (2), wherein the silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2);

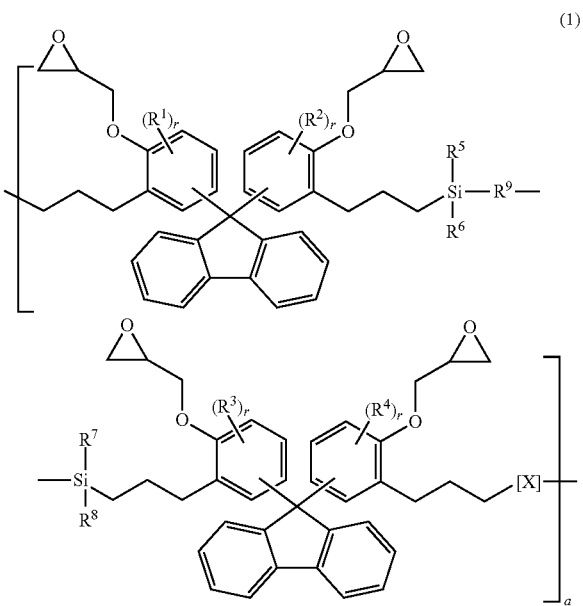

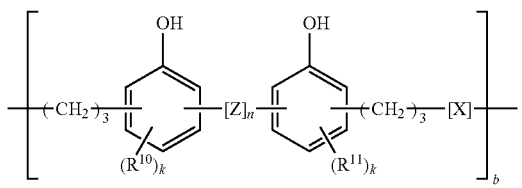

(2)

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of

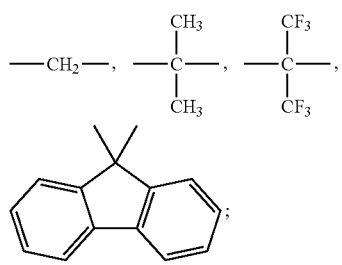

and X represents a divalent organic group shown by the following formula (3) or the following general formula (4), (3)

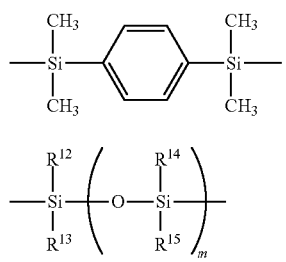

(4)

wherein $R^{12}$, $R^{13}$, $R^{14}$, and $R^{15}$ may be the same or different and represent a monovalent hydrocarbon group having 1 to 10 carbon atoms; and m represents a positive number of 1 to 100;

(B) a photosensitive acid generator capable of generating an acid by decomposition with light having a wavelength of 190 to 500 nm;

(C) one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group; and (D) one or two or more compounds selected from polyhydric phenols having 3 or more hydroxyl groups.

Such a photo-curable resin composition can facilitate thick and fine patterning when this composition is used in patterning.

The photo-curable resin composition preferably further comprises (E) a basic compound.

Blending the basic compound in the photo-curable resin composition enhances resolution of a photo-curable resin layer composed of the photo-curable resin composition, reduces the change of sensitivity after exposure, decreases dependence on a substrate and an environment, and thus improves exposure margin, pattern profile, and the like.

Furthermore, the present invention provides a photo-curable dry film comprising a photo-curable resin layer composed of a film of the above photo-curable resin composition, the photo-curable resin layer having a thickness of 100 μm to 300 μm.

Such a photo-curable dry film can facilitate thick and fine patterning when this film is used in patterning.

Advantageous Effects of Invention

The present invention provides a photo-curable resin composition which uses a specific silicone polymer compound, photosensitive acid generator, and other components. This composition allows fine patterning of a thick film, particularly 100 μm to 300 μm thick.

The photo-curable resin composition can easily form a coating film that exhibits, when the film is patterned with light and then subjected to heat treatment at a low temperature of 250° C. or lower, excellent adhesiveness to a substrate used for an electronic part, a semiconductor device, or a circuit substrate, excellent mechanical characteristics, electric insulation property, reliability as an insulating top coat, and chemical resistance, and hardly causes cracks. Thus, this composition is suitably used for forming a top coat to protect electric and electronic parts such as a circuit substrate, a semiconductor device, and a display element and for bonding substrates.

DESCRIPTION OF EMBODIMENTS

Hereinafter, the present invention will be described in detail.

As mentioned above, a photo-curable resin composition and a photo-curable dry film using the same that can facilitate thick and fine patterning when used in patterning have been demanded.

The present inventors have earnestly investigated to achieve the above object. Consequently, they found that the photo-curable resin composition containing the following components (A) to (D) and a photo-curable dry film using the same can achieve the object, thereby bringing the present invention to completion.

Hereinafter, embodiments of the present invention will be specifically described, but the present invention is not limited thereto.

The photo-curable resin composition of the present invention contains:

(A) a silicone polymer compound having an epoxy group-containing repeating unit shown by the following general formula (1) and a phenolic hydroxyl group-containing repeating unit shown by the following general formula (2), wherein the silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2);

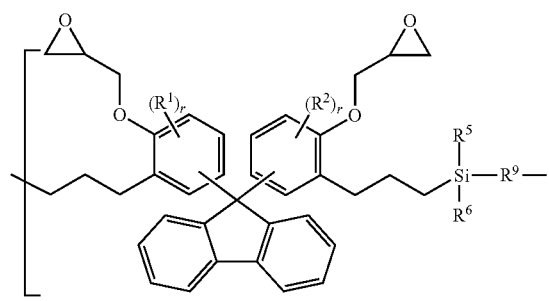
(1)

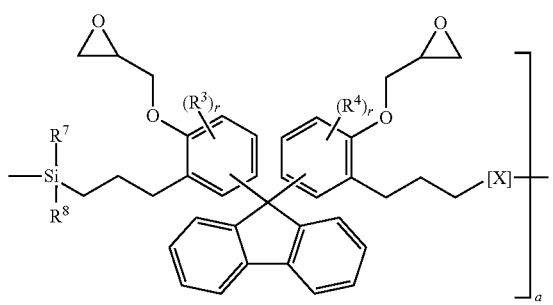
(2)

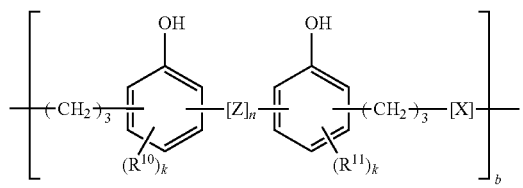

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of

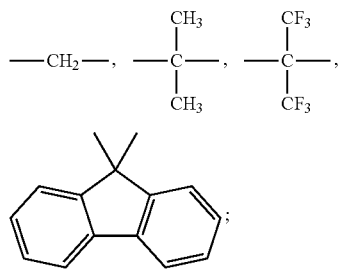

and X represents a divalent organic group shown by the following formula (3) or the following general formula (4),

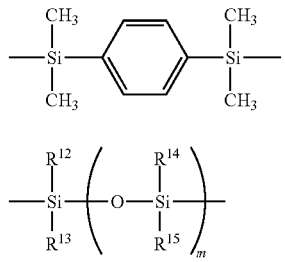
(3)

$$\text{(4)}$$

wherein $R^{12}$, $R^{13}$, $R^{14}$, and $R^{15}$ may be the same or different and represent a monovalent hydrocarbon group having 1 to 10 carbon atoms; and m represents a positive number of 1 to 100;

(B) a photosensitive acid generator capable of generating an acid by decomposition with light having a wavelength of 190 to 500 nm;

(C) one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group; and (D) one or two or more compounds selected from polyhydric phenols having 3 or more hydroxyl groups.

Such a photo-curable resin composition can facilitate thick and fine patterning when the composition is used in patterning. In addition, this composition can be post-cured even at low temperature into a coating film that is excellent in various film characteristics, particularly, adhesiveness to a substrate used for a circuit substrate, reliability as electric and electronic parts, and chemical resistance.

Each component of the inventive photo-curable resin composition will be described below.

[Component (A)]

The component (A) is a silicone polymer compound having an epoxy group-containing repeating unit shown by the following general formula (1) and a phenolic hydroxyl group-containing repeating unit shown by the following general formula (2). The silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2),

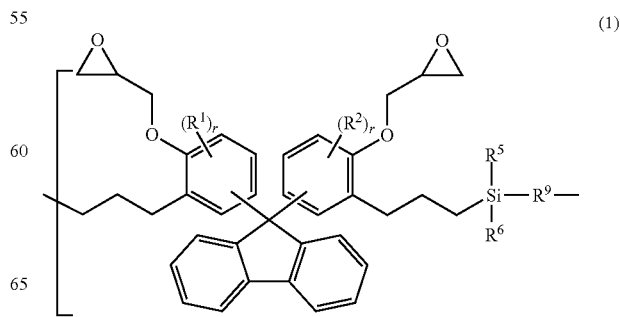
(1)

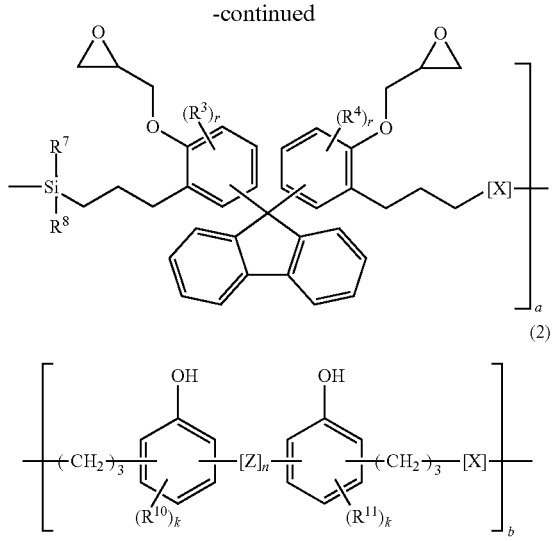

(2)

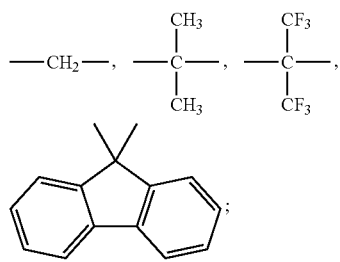

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of

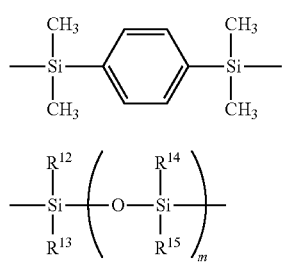

and X represents a divalent organic group shown by the following formula (3) or the following general formula (4), $$\begin{array}{c} CH_3 \\ | \\ -Si- \\ | \\ CH_3 \end{array} \!\!\!\!\!\!\!\!\!\!\!\!\!\! \begin{array}{c} \\ \\ \\ \end{array} \!\!\!\!\!\!\!\!\!\!\!\!\!\! \begin{array}{c} CH_3 \\ | \\ -Si- \\ | \\ CH_3 \end{array}$$ (3)

$$-\!\!\!\!\underset{R^{13}}{\overset{R^{12}}{\underset{|}{Si}}}\!\!\!\!-\!\!\!\left(\!\!O\!-\!\!\underset{R^{15}}{\overset{R^{14}}{\underset{|}{Si}}}\!\!\right)_{\!\!m}$$ (4)

wherein $R^{12}$, $R^{13}$, $R^{14}$, and $R^{15}$ may be the same or different and represent a monovalent hydrocarbon group having 1 to 10 carbon atoms; and m represents a positive number of 1 to 100.

$R^1$ to $R^4$ in the general formula (1) each represent a hydrogen atom or an alkyl or alkoxy group having 1 to 4 carbon atoms. These may be the same or different from each other. Illustrative examples of the alkyl or alkoxy group having 1 to 4 carbon atoms include a methyl group, an ethyl group, an isopropyl group, a tert-butyl group, a methoxy group, an ethoxy group, and an isopropyloxy group.

$R^5$ to $R^8$ in the general formula (1) independently represent a hydrogen atom or a monovalent hydrocarbon group having 1 to 10 carbon atoms. Illustrative examples of the monovalent hydrocarbon group having 1 to 10 carbon atoms include linear, branched, or cyclic alkyl groups such as a methyl group, an ethyl group, a propyl group, an isopropyl group, a butyl group, an isobutyl group, an octyl group, and a cyclohexyl group; and aryl groups such as a phenyl group, a tolyl group, and a naphthyl group. Among them, a methyl group is preferable in view of availability of the raw material.

$R^9$ in the general formula (1) represents a divalent hydrocarbon group having 1 to 10 carbon atoms. Illustrative examples of $R^9$ include linear, branched, or cyclic alkylene groups such as a methylene group, an ethylene group, a propylene group, a butylene group, a pentylene group, a hexylene group, a cyclohexylene group, a heptylene group, an octylene group, a nonylene group, and a decylene group; and arylene groups such as a phenylene group, a tolylene group, and a naphthylene group. Among them, a phenylene group is preferable in view of availability of the raw material.

$R^{10}$ and $R^{11}$ in the general formula (2) each represent an alkyl or alkoxy group having 1 to 4 carbon atoms. These may be the same or different from each other. Illustrative examples of $R^{10}$ and $R^{11}$ include a methyl group, an ethyl group, an isopropyl group, a tert-butyl group, a methoxy group, an ethoxy group, and an isopropyloxy group.

$R^{12}$ to $R^{15}$ in the general formula (4) may be the same or different and represent a monovalent hydrocarbon group having 1 to 10 carbon atoms. $R^{12}$ to $R^{15}$ are preferably a monovalent hydrocarbon group having 1 to 8 carbon atoms, more preferably a monovalent hydrocarbon group having 1 to 6 carbon atoms. Illustrative examples of $R^{12}$ to $R^{15}$ include linear, branched, or cyclic alkyl groups such as a methyl group, an ethyl group, a propyl group, an isopropyl group, a n-butyl group, a tert-butyl group, an isobutyl group, an octyl group, and a cyclohexyl group; linear, branched, or cyclic alkenyl groups such as a vinyl group, an allyl group, a propenyl group, a butenyl group, a hexenyl group, and a cyclohexenyl group; aryl groups such as a phenyl group, a tolyl group, and a naphthyl group; and aralkyl groups such as a benzyl group and a phenethyl group. Among them, a methyl group is preferable in view of availability of the raw material.

m in the general formula (4) is a positive number of 1 to 100, preferably 1 to 80, in view of compatibility with a later-described components (B) to (D) and photo-curability.

a in the general formula (1) and b in the general formula (2) are a positive number, preferably satisfying 0<a<1, 0<b<1, and a+b=1, more preferably 0.05≤a≤0.8 and 0.2≤b≤0.95, particularly preferably 0.2≤a≤0.8 and 0.2≤b≤0.8.

The ratio (mole ratio) between epoxy groups (J) in the general formula (1) and phenolic hydroxyl groups (K) in the general formula (2) satisfies 0.05≤J/(J+K)≤0.95, preferably 0.10≤J/(J+K)≤0.90, more preferably 0.10≥J/(J+K)≥0.85. Fewer epoxy groups (J) reduce adhesiveness to a substrate, while more epoxy groups (J) reduce pattern resolution.

The silicone polymer compound has a weight average molecular weight of 3,000 to 500,000, preferably 3,000 to 300,000, more preferably 5,000 to 250,000. Such molecular weight is preferable in view of photo-curability of the photo-curable resin composition containing this silicone polymer compound and the dry film using the photo-curable resin composition for a photo-curable resin layer and mechanical characteristics of a cured film obtained by curing the photo-curable resin layer. Herein, the weight average molecular weight is determined by gel permeation chromatography (GPC) in terms of polystyrene (the same shall apply hereinafter).

Illustrative examples of the epoxy group-containing component shown by the general formula (1) are shown below.

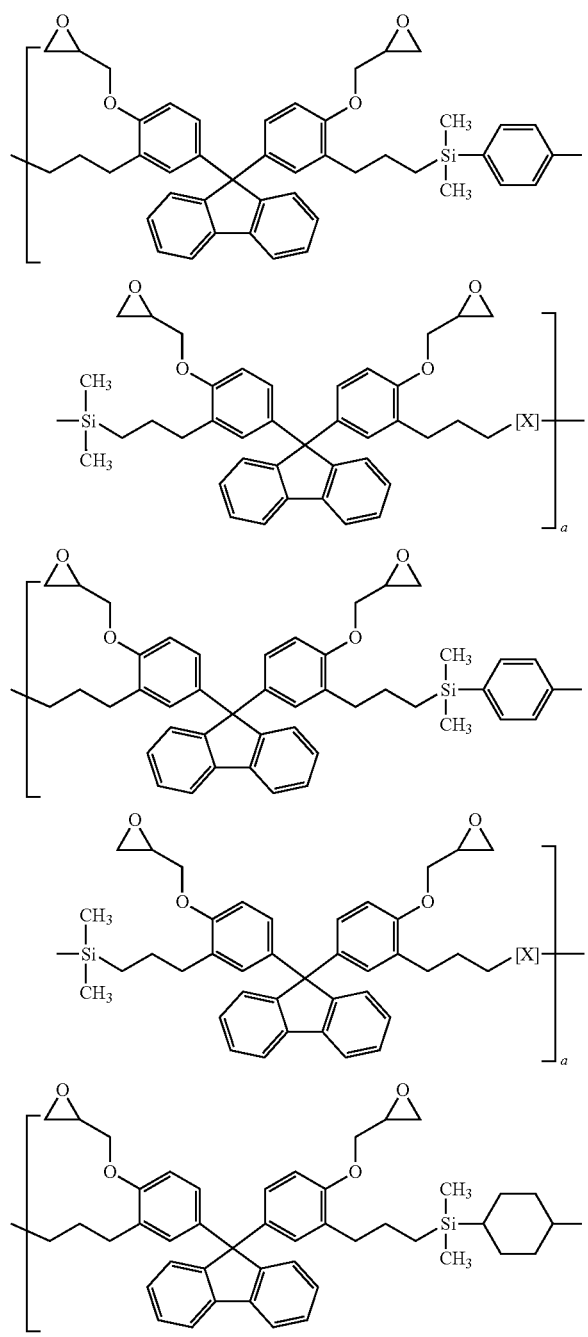

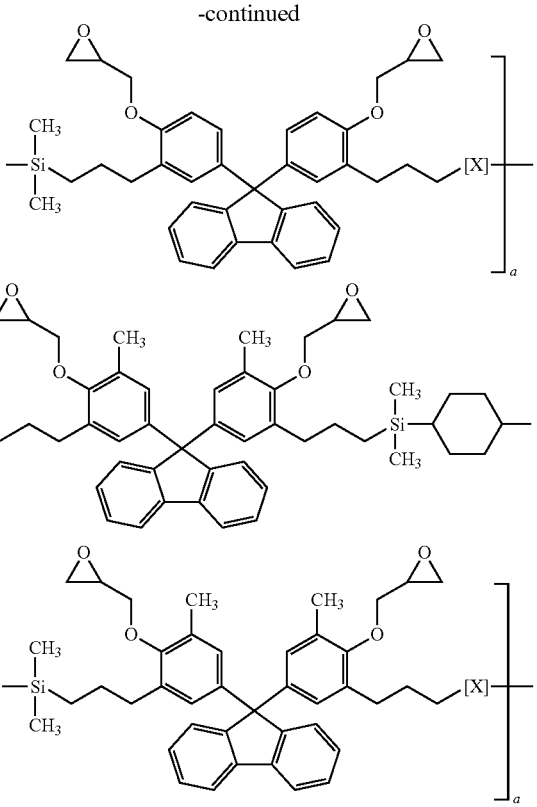

Such component (A), a silicone polymer compound, can be produced by, for example, the following procedure.

First, a compound shown by the following general formula (5) is produced,

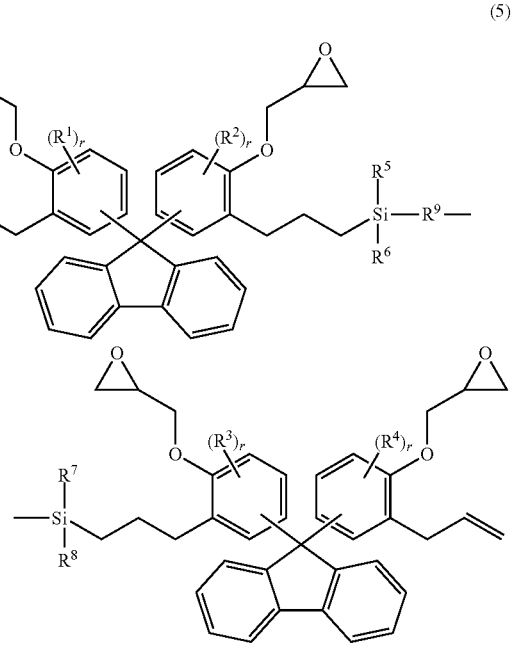

(5)

wherein $R^1$ to $R^9$ and r are as defined above.

The compound shown by the general formula (5) can be produced by, for example, hydrosilylation polymerization reaction of an allyl compound shown by the following general formula (6) with a silicon compound shown by the following general formula (7),

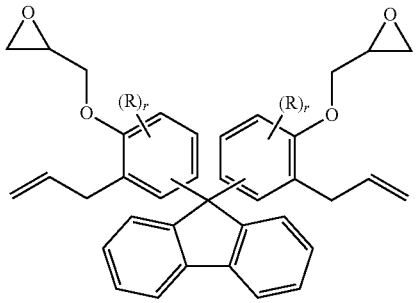
(6)

wherein R represents a group corresponding to $R^1$ to $R^4$; and r is as defined above, $$HSiR^5R^6—R^9—SiR^7R^8H \quad (7)$$

wherein $R^5$ to $R^9$ are as defined above.

Alternatively, the compound shown by the general formula (5) can be produced by producing a compound shown by the following general formula (9) by hydrosilylation polymerization reaction of an allyl compound shown by the following general formula (8) with a silicon compound shown by the general formula (7) and then reacting the compound shown by the general formula (9) with epichlorohydrin,

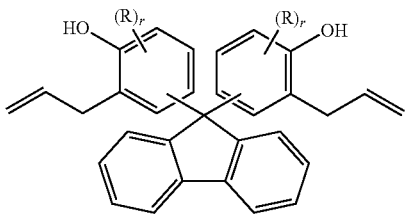
(8)

wherein R and r are as defined above,

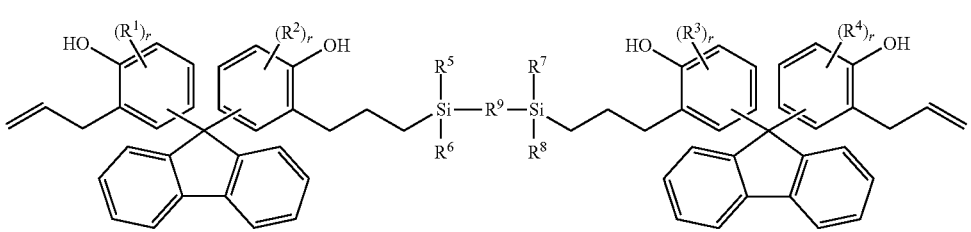
(9)

wherein $R^1$ to $R^9$ and r are as defined above.

The compound shown by the general formula (5) is then subjected to hydrosilylation polymerization reaction, in the presence of a catalyst, with an allyl compound shown by the following general formula (10) and either or both of hydrogensilphenylene shown by the following formula (11) and dihydroorganosiloxane shown by the following general formula (12) to produce a silicone polymer compound of component (A),

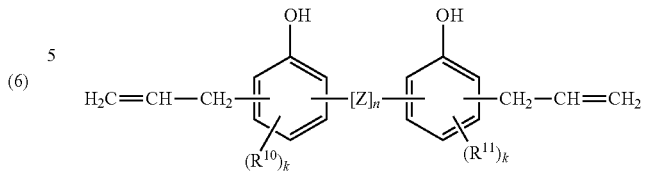
(10)

wherein n, k, $R^{10}$, $R^{11}$, and Z are as defined above,

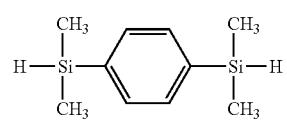
(11)

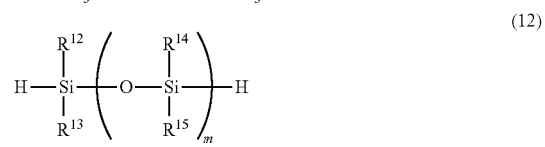
(12)

wherein $R^{12}$ to $R^{15}$ and m are as defined above.

In this reaction, the compound shown by the general formula (5) and the allyl compound shown by the general formula (10) are mixed such that the component (A) satisfies the above ratio between the epoxy groups (J) and the phenolic hydroxyl groups (K).

In the silicone polymer compound of component (A), the epoxy group-containing repeating unit shown by the general formula (1) and the phenolic hydroxyl group-containing repeating unit shown by the general formula (2) may be introduced as blocks, or may be introduced at random.

Examples of the catalyst that can be used in the polymerization reaction include platinum group metal elements such as platinum (including platinum black), rhodium, and palladium; platinum chloride, chloroplatinic acid, and chloroplatinic acid salts such as $H_2PtCl_4.xH_2O$, $H_2PtCl_6.xH_2O$, $NaHPtCl_6.xH_2O$, $KHPtCl_6.xH_2O$, $Na_2PtCl_6.xH_2O$, $K_2PtCl_4.xH_2O$, $PtCl_4.xH_2O$, $PtCl_2$, $Na_2HPtCl_4.xH_2O$ (wherein x is preferably an integer of 0 to 6, particularly preferably 0 or 6); alcohol-modified chloroplatinic acid (U.S. Pat. No. 3,220,972); complexes of chloroplatinic acid with olefins (U.S. Pat. No. 3,159,601, U.S. Pat. No. 3,159,662, and U.S. Pat. No. 3,775,452); platinum group metals such as platinum black and palladium on supports such as alumina, silica and carbon; rhodium-olefin complexes; chlorotris(triphenylphosphine)rhodium (so-called Wilkinson's catalyst); and complexes of platinum chloride, chloroplatinic acid, or chloroplatinic acid salts with vinyl-containing siloxanes (particularly, vinyl-containing cyclic siloxanes).

The amount thereof to be used is a catalytic amount, and in general, it is preferably 0.001 to 0.1 mass % in terms of a platinum group metal with respect to the total amount of the reaction polymer.

In the polymerization reaction, a solvent may be used, if necessary. Preferable examples of the solvent include hydrocarbon solvents such as toluene and xylene.

With respect to the polymerization condition, the polymerization temperature is preferably, for example, 40 to 150° C., particularly preferably 60 to 120° C., for the catalyst is not deactivated and the polymerization can be brought to completion in a short time.

Although the polymerization time depends on the type and the amount of a desired polymer, polymerization is preferably completed within about 0.5 to 100 hours, more preferably about 0.5 to 30 hours, to prevent moisture from entering into the polymerization system. If a solvent is used, the solvent is distilled off after completion of the polymerization reaction. In this way, a silicone polymer compound of component (A) can be obtained.

[Component (B)]

The component (B) is a photosensitive acid generator capable of generating an acid by decomposition with light having a wavelength of 190 to 500 nm. (B) The photosensitive acid generator may be a compound capable of generating an acid by exposure to light having a wavelength of 190 to 500 nm which serves as a curing catalyst. The component (A) has excellent compatibility with a photosensitive acid generator, so that various photosensitive acid generators can be used. Examples of the photosensitive acid generator include an onium salt, a diazomethane derivative, a glyoxime derivative, a β-ketosulfone derivative, a disulfone derivative, a nitrobenzylsulfonate derivative, a sulfonate ester derivative, an imide-yl-sulfonate derivative, an oximesulfonate derivative, an iminosulfonate derivative, and a triazine derivative.

Examples of the onium salt include a compound shown by the general formula (13),

wherein $R^{16}$ represents an optionally substituted linear, branched, or cyclic alkyl group having 1 to 12 carbon atoms, an aryl group having 6 to 12 carbon atoms, or an aralkyl group having 7 to 12 carbon atoms; $M^+$ represents an iodonium ion or a sulfonium ion; $K^-$ represents a non-nucleophilic counter ion; and j is 2 or 3.

As to $R^{16}$, illustrative examples of the alkyl group include a methyl group, an ethyl group, a propyl group, a butyl group, a cyclohexyl group, a 2-oxocyclohexyl group, a norbornyl group, and an adamantyl group. Illustrative examples of the aryl group include a phenyl group; alkoxyphenyl groups such as an o-, m-, or p-methoxyphenyl group, an o-, m-, or p-ethoxyphenyl group, and a m- or p-tert-butoxyphenyl group; and alkylphenyl groups such as a 2-, 3-, or 4-methylphenyl group, a 2-, 3-, or 4-ethylphenyl group, a 4-tert-butylphenyl group, a 4-butylphenyl group, and a dimethylphenyl group. Illustrative examples of the aralkyl group include a benzyl group and a phenethyl group.

Illustrative examples of the non-nucleophilic counter ion $K^-$ include halide ions such as a chloride ion and a bromide ion; fluoroalkyl sulfonates such as triflate, 1,1,1-trifluoroethane sulfonate, and nonafluorobutane-sulfonate; aryl sulfonates such as tosylate, benzenesulfonate, 4-fluorobenzenesulfonate, and 1,2,3,4,5-pentafluorobenzenesulfonate; and alkyl sulfonates such as mesylate and butanesulfonate.

Examples of the diazomethane derivative include a compound shown by the general formula (14),

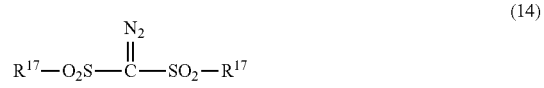

wherein $R^{17}$ may be the same or different and represents a linear, branched, or cyclic alkyl group or halogenated alkyl group having 1 to 12 carbon atoms, an aryl group or halogenated aryl group having 6 to 12 carbon atoms, or an aralkyl group having 7 to 12 carbon atoms.

As to $R^{17}$, illustrative examples of the alkyl group include a methyl group, an ethyl group, a propyl group, a butyl group, an amyl group, a cyclopentyl group, a cyclohexyl group, a norbornyl group, and an adamantyl group. Illustrative examples of the halogenated alkyl group include a trifluoromethyl group, a 1,1,1-trifluoroethyl group, a 1,1,1-trichloroethyl group, and a nonafluorobutyl group. Illustrative examples of the aryl group include a phenyl group; alkoxyphenyl groups such as an o-, m-, or p-methoxyphenyl group, an o-, m-, or p-ethoxyphenyl group, and a m- or p-tert-butoxyphenyl group; and alkylphenyl groups such as a 2-, 3-, or 4-methylphenyl group, a 2-, 3-, or 4-ethylphenyl group, a 4-tert-butylphenyl group, a 4-butylphenyl group, and a dimethylphenyl group. Illustrative examples of the halogenated aryl group include a fluorophenyl group, a chlorophenyl group, and a 1,2,3,4,5-pentafluorophenyl group. Illustrative examples of the aralkyl group include a benzyl group and a phenethyl group.

Illustrative examples of the photosensitive acid generator include onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluolobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, and diphenyl(4-thiophenoxyphenyl)sulfonium hexafluoroantimonate; diazomethane derivatives such as bis(benzenesulfonyl) diazomethane, bis(p-toluenesulfonyl) diazomethane, bis(xylenesulfonyl) diazomethane, bis(cyclohexylsulfonyl) diazomethane, bis(cyclopentylsulfonyl) diazomethane, bis(n-butylsulfonyl) diazomethane, bis(isobutylsulfonyl) diazomethane, bis(sec-butylsulfonyl) diazomethane, bis(n-propylsulfonyl) diazomethane, bis(isopropylsulfonyl) diazomethane, bis(tert-butylsulfonyl) diazomethane, bis(n-amylsulfonyl) diazomethane, bis(isoamylsulfonyl) diazomethane, bis(sec-amylsulfonyl) diazomethane, bis(tert-amylsulfonyl) diazomethane, 1-cyclohexylsulfonyl-1-(tert-butylsulfonyl) diazomethane, 1-cyclohexylsulfonyl-1-(tert-amylsulfonyl) diazomethane, and 1-tert-amylsulfonyl-1-(tert-butylsulfonyl) diazomethane; glyoxime derivatives such as bis-o-(p-toluenesulfonyl)-α-dimethyl glyoxime, bis-o-(p-toluenesulfonyl)-α-diphenyl glyoxime, bis-o-(p-toluenesulfonyl)-α-dicyclohexyl glyoxime, bis-o-(p-toluenesulfonyl)-2,3-pentanedione glyoxime, bis-(p-toluenesulfonyl)-2-methyl-3,4-pentanedione glyoxime, bis-o-(n-butanesulfonyl)-α-dimethyl glyoxime, bis-o-(n-butanesulfonyl)-α-diphenyl glyoxime, bis-o-(n-butanesulfonyl)-α-dicyclohexyl glyoxime, bis-o-(n-butanesulfonyl)-2,3-pentanedione glyoxime, bis-o-(n-butanesulfonyl)-2-methyl-3,4-pentanedione glyoxime, bis-o-(methanesulfonyl)-α-dimethyl glyoxime, bis-o-(trifluoromethanesulfonyl)-α-dimethyl glyoxime, bis-o-(1,1,1-trifluoroethanesulfonyl)-α-dimethyl glyoxime, bis-o-(tert-butanesulfonyl)-α-dimethyl glyoxime, bis-o-(perfluorooctanesulfonyl)-α-dimethyl glyoxime, bis-o-(cyclohexanesulfonyl)-α-dimethyl glyoxime, bis-o-(benzenesulfonyl)-α-dimethyl glyoxime, bis-o-(p-fluorobenzenesulfonyl)-α-dimethyl glyoxime, bis-o-(p-tert-butylbenzenesulfonyl)-α-dimethyl glyoxime, bis-o-(xylenesulfonyl)-α-dimethyl glyoxime, and bis-o-(camphersulfonyl)-α-dimethyl glyoxime; oxime sulfonate derivatives such as α-(benzenesulfoniumoxyimino)-4-methylphenylacetonitrile; β-keto sulfone derivatives such as 2-cyclohexylcarbonyl-2-(p-toluenesulfonyl) propane and 2-isopropylcarbonyl-2-(p-toluenesulfonyl) propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; imide-yl-sulfonate derivatives such as phthalimide-yl-triflate, phthalimide-yl-tosylate, 5-norbornene 2,3-dicarboxyimide-yl-triflate, 5-norbornene 2,3-dicarboxyimide-yl-tosylate, 5-norbornene 2,3-dicarboxyimide-yl-n-butylsulfonate, and n-trifluoromethylsulfonyloxy naphthylimide; iminosulfonate derivatives such as (5-(4-methylphenyl)sulfonyloxyimino-5H-thiophene-2-ylidene)-(2-methylphenyl)acetonitrile and (5-(4-(4-methylphenylsulfonyloxy)phenylsulfonyloxyimino)-5H-thiophene-2-ylidene)-(2-methylphenyl)acetonitrile; and 2-methyl-2[(4-methylphenyl)sulfonyl]-1-[(4-methylthio)phenyl]-1-propane. Among them, imide-yl-sulfonate derivatives, iminosulfonate derivatives, and oximesulfonate derivatives are preferably used.

The photosensitive acid generator of component (B) used may be one kind alone or a combination of two or more kinds.

The formulation amount of the photosensitive acid generator of component (B) is preferably 0.05 to 20 parts by mass, particularly preferably 0.2 to 5 parts by mass, based on 100 parts by mass of the silicone polymer compound of component (A), in view of light absorption of the photosensitive acid generator itself and photo-curability of a thick film. A formulation amount of 0.05 parts by mass or more prevents a pattern failure due to lack of acid generated. A formulation amount of 20 parts by mass or less prevents the composition from curing due to diffusion of excess acid into unexposed parts.

[Component (C)]

The component (C) is one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group.

Examples of the amino condensate modified with formaldehyde or formaldehyde-alcohol include melamine condensates modified with formaldehyde or formaldehyde-alcohol and urea condensates modified with formaldehyde or formaldehyde-alcohol. The melamine condensate modified with formaldehyde or formaldehyde-alcohol can be synthesized by the following procedure, for example. First, a melamine monomer is modified with formalin into a methylol form, and optionally, the resultant compound is further modified with alcohol into an alkoxy form according to a known method, thereby obtaining a modified melamine shown by the general formula (15). The alcohol is preferably a lower alcohol, for example, an alcohol having 1 to 4 carbon atoms.

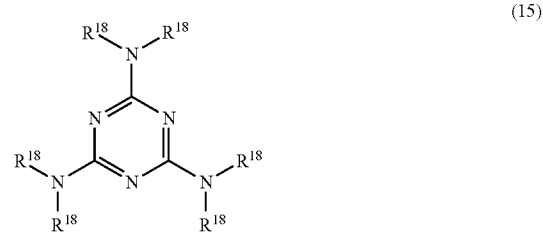

(15)

In the above formula, each $R^{18}$ may be the same or different and represents a methylol group, an alkoxymethyl group containing an alkoxy group having 1 to 4 carbon atoms, or a hydrogen atom, provided that at least one $R^{18}$ is a methylol group or an alkoxymethyl group.

Examples of $R^{18}$ include a methylol group, alkoxymethyl groups such as a methoxymethyl group and an ethoxymethyl group, and a hydrogen atom.

Illustrative examples of the modified melamine shown by the general formula (15) include trimethoxymethyl monomethylol melamine, dimethoxymethyl monomethylol melamine, trimethylol melamine, hexamethylol melamine, and hexamethoxymethylol melamine.

Then, the modified melamine shown by the general formula (15) or the multimeric compound thereof (e.g. oligomer including dimer and trimer) is polymerized by addition condensation with formaldehyde until a desired molecular weight is achieved according to a known method, thereby obtaining the melamine condensate modified with formaldehyde or formaldehyde-alcohol.

The urea condensate modified with formaldehyde or formaldehyde-alcohol can be synthesized by modifying a urea condensate having a desired molecular weight with formaldehyde into a methylol form, and optionally, further modifying the resultant compound with alcohol into an alkoxy form, according to a known method.

Examples of the urea condensate modified with formaldehyde or formaldehyde-alcohol include a methoxymethylated urea condensate, an ethoxymethylated urea condensate, and a propoxymethylated urea condensate. These urea condensates modified with formaldehyde or formaldehyde-alcohol may be used solely or in combination of two or more kinds.

Examples of the phenol compound having on average two or more methylol groups or alkoxymethylol groups per molecule include (2-hydroxy-5-methyl)-1,3-benzenedimethanol, 2,2',6,6'-tetramethoxymethyl bisphenol A. These phenol compounds may be used solely or in combination of two or more kinds.

Examples of the polyhydric phenol compound whose phenolic hydroxyl group is substituted with a glycidoxy group include 1,1'-diglycidoxy bisphenol A, tris(4-glycidoxyphenyl)methane, and 1,1,1-tris(4-glycidoxyphenyl)ethane, which are obtained by reacting, in the presence of a base, hydroxyl groups of bisphenol A, tris(4-hydroxyphenyl)methane, or 1,1,1-tris(4-hydroxyphenyl)ethane with epichlorohydrin. These polyhydric phenol compounds whose phenolic hydroxyl group is substituted with a glycidoxy group may be used solely or in combination of two or more kinds.

The component (C) used may be one kind alone or a combination of two or more kinds.

[Component (D)]

The component (D) is one or two or more compounds selected from polyhydric phenols having 3 or more hydroxyl groups. Examples of the component (D) include alkylphenols such as phenol, bisphenol A, p-tert-butylphenol, octylphenol, and p-cumylphenol, a resol-type phenol resin synthesized by using p-phenylphenol and cresol as raw materials, and a novolak-type phenol resin. Other examples include tris(4-hydroxyphenyl)methane and 1,1,1-tris(4-hydroxyphenyl)ethane.

The component (D) used may be one kind alone or a combination of two or more kinds.

The components (C) and (D) may serve as crosslinking agents.

The components (C) and (D) are components that serve to facilitate patterning by undergoing curing reaction with the silicone polymer compound of component (A) and increase the strength of the cured product. The weight average molecular weights of the components (C) and (D) are preferably 150 to 10,000, particularly preferably 200 to 3,000 each, in view of photo-curability and heat resistance.

The total amount of the components (C) and (D) is preferably 0.5 to 50 parts by mass, more preferably 1 to 30 parts by mass, based on 100 parts by mass of the silicone polymer compound of component (A), in view of photo-curability and reliability as a post-cured top coat to protect electric and electronic parts. Both the components (C) and (D) are more than 0 part by mass. More specifically, the mass ratio (C)/(D) ranges from 1/99 to 99/1, preferably from 30/70 to 70/30. Such a formulation amount prevents problems of connection between patterns and decrease in resolution.

[Component (E)]

The inventive photo-curable resin composition may further contain (E) a basic compound, if necessary. The basic compound is preferably a compound capable of reducing diffusion rate of an acid generated from the photosensitive acid generator into a resist film. Blending the basic compound enhances resolution, reduces the change of sensitivity after exposure, decreases dependence on a substrate and an environment, and thus improves exposure margin, pattern profile, and the like.

Examples of the basic compound include primary, secondary, and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, nitrogen-containing alcoholic compounds, amide derivatives, and imide derivatives.

Illustrative examples of the primary aliphatic mines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Illustrative examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylene diamine, N,N-dimethylethylene diamine, and N,N-dimethyltetraethylene pentamine.

Illustrative examples of the tertiary aliphatic amines include trimethylamine, triethylamine, tri-n-propylamine, triisopropylamine, tri-n-butylamine, triisobutylamine, tri-sec-butylamine, tripentylamine, triethanolamine, tert-butyldiethanolamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylene diamine, N,N,N',N'-tetramethylethylene diamine, and N,N,N',N'-tetramethyltetraethylene pentamine.

Illustrative examples of the mixed amines include dimethylethylamine, methylethylpropylamine, benzylamine, phenethylamine, and benzyldimethylamine.

Illustrative examples of the aromatic amines and the heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g, pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pirazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Illustrative examples of the nitrogen-containing compound having a carboxyl group include amino benzoic acid, indole carboxylic acid, and amino acid derivatives (e.g., nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxy alanine).

Illustrative examples of the nitrogen-containing compound having a sulfonyl group include 3-pyridinesulfonic acid and pyridinium p-toluenesulfonate.

Illustrative examples of the nitrogen-containing compound having a hydroxyl group, the nitrogen-containing compound having a hydroxyphenyl group, and the nitrogen-containing alcoholic compound include 2-hydroxy pyridine, amino cresol, 2,4-quinoline diol, 3-indole methanol hydrate, monoethanol amine, diethanol amine, triethanol amine, N-ethyl diethanol amine, N,N-diethyl ethanol amine, triisopropanol amine, 2,2'-imino diethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotine amide.

Illustrative examples of the amide derivative include formamide, N-methyl formamide, N,N-dimethyl formamide, acetamide, N-methyl acetamide, N,N-dimethyl acetamide, propione amide, and benzamide.

Illustrative examples of the imide derivative include phthalimide, succinimide, and maleimide.

Moreover, one or two or more compounds selected from basic compounds shown by the following general formula (16) may be added, $$N(\alpha)_q(\beta)_{3-q} \quad (16)$$

wherein q represents 1, 2, or 3; the side chain α may be the same or different and represents a substituent shown by any of the general formulae (17) to (19); the side chain β may be the same or different and represents a hydrogen atom or a linear, branched, or cyclic alkyl group having 1 to 20 carbon atoms and optionally containing an ether bond or a hydroxyl group; and the side chains α may be bonded with each other to form a ring.

(17)

(18)

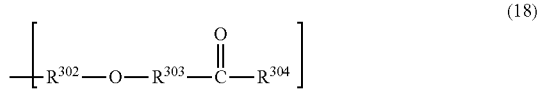

(19)

In the above formula, $R^{300}$, $R^{302}$, and $R^{305}$ represent a linear or branched alkylene group having 1 to 4 carbon atoms; $R^{301}$ and $R^{304}$ represent a hydrogen atom, or a linear, branched, or cyclic alkyl group having 1 to 20 carbon atoms and optionally containing one or more groups selected from a hydroxyl group, an ether bond, an ester bond, and a lactone ring; $R^{303}$ represents a single bond, or a linear or branched alkylene group having 1 to 4 carbon atoms; and $R^{306}$ represents a linear, branched, or cyclic alkyl group having 1 to 20 carbon atoms and optionally containing one or more groups selected from a hydroxyl group, an ether bond, an ester bond, and a lactone ring.

Illustrative examples of the compound shown by the general formula (16) include tris[2-(methoxymethoxy)ethyl] amine, tris[2-(2-methoxyethoxy)ethyl] amine, tris[2-(2-methoxyethoxymethoxy)ethyl] amine, tris[2-(1-methoxyethoxy)ethyl] amine, tris[2-(1-ethoxyethoxy) ethyl] amine, tris[2-(1-ethoxypropoxy) ethyl] amine, tris[2-{2-(2-hydroxyethoxy)ethoxy}ethyl] amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl) amine, tris(2-acetoxyethyl) amine, tris(2-propionyloxyethyl) amine, tris(2-butyryloxyethyl) amine, tris(2-isobutyryloxyethyl) amine, tris(2-valeryloxyethyl) amine, tris(2-pivaloyloxyethyl) amine, N,N-bis(2-acetoxyethyl) 2-(acetoxyacetoxy)ethyl amine, tris(2-methoxycarbonyloxyethyl) amine, tris(2-tert-butoxycarbonyloxyethyl) amine, tris[2-(2-oxopropoxy)ethyl] amine, tris[2-(methoxycarbonylmethyl)oxyethyl] amine, tris[2-(tert-butoxycarbonylmethyloxy)ethyl] amine, tris[2-(cyclohexyloxycarbonylmethyloxy)ethyl] amine, tris(2-methoxycarbonylethyl) amine, tris(2-ethoxycarbonylethyl) amine, N,N-bis(2-hydroxyethyl) 2-(methoxycarbonyl)ethyl amine, N,N-bis(2-acetoxyethyl) 2-(methoxycarbonyl)ethyl amine, N,N-bis(2-hydroxyethyl) 2-(ethoxycarbonyl)ethyl amine, N,N-bis(2-acetoxyethyl) 2-(ethoxycarbonyl)ethyl amine, N,N-bis(2-hydroxyethyl) 2-(2-methoxyethoxycarbonyl)ethyl amine, N,N-bis(2-acetoxyethyl) 2-(2-methoxyethoxycarbonyl)ethyl amine, N,N-bis(2-hydroxyethyl) 2-(2-hydroxyethoxycarbonyl)ethyl amine, N,N-bis(2-acetoxyethyl) 2-(2-acetoxyethoxycarbonyl)ethyl amine, N,N-bis(2-hydroxyethyl) 2-[(methoxycarbonyl)methoxycarbonyl]ethyl amine, N,N-bis(2-acetoxyethyl) 2-[(methoxycarbonyl)methoxycarbonyl]ethyl amine, N,N-bis(2-hydroxyethyl) 2-(2-oxopropoxycarbonyl)ethyl amine, N,N-bis(2-acetoxyethyl) 2-(2-oxopropoxycarbonyl)ethyl amine, N,N-bis(2-hydroxyethyl) 2-(tetrahydrofurfuryloxycarbonyl)ethyl amine, N,N-bis(2-acetoxyethyl) 2-(tetrahydrofurfuryloxycarbonyl)ethyl amine, N,N-bis(2-hydroxyethyl) 2-[(2-oxotetrahydrofuran-3-yl)oxycarbonyl]ethyl amine, N,N-bis(2-acetoxyethyl) 2-[(2-oxotetrahydrofuran-3-yl)oxycarbonyl]ethyl amine, N,N-bis(2-hydroxyethyl) 2-(4-hydroxybutoxycarbonyl)ethyl amine, N,N-bis(2-formyloxyethyl) 2-(4-formyloxybutoxycarbonyl) ethyl amine, N,N-bis(2-formyloxyethyl) 2-(2-formyloxyethoxycarbonyl)ethyl amine, N,N-bis(2-methoxyethyl) 2-(methoxycarbonyl)ethyl amine, N-(2-hydroxyethyl) bis[2-(methoxycarbonyl)ethyl] amine, N-(2-acetoxyethyl) bis[2-(methoxycarbonyl)ethyl] amine, N-(2-hydroxyethyl) bis[2-(ethoxycarbonyl)ethyl] amine, N-(2-acetoxyethyl) bis[2-(ethoxycarbonyl)ethyl] amine, N-(3-hydroxy-1-propyl) bis[2-(methoxycarbonyl)ethyl] amine, N-(3-acetoxy-1-propyl) bis[2-(methoxycarbonyl)ethyl] amine, N-(2-methoxyethyl) bis[2-(methoxycarbonyl)ethyl] amine, N-butyl bis[2-(methoxycarbonyl)ethyl] amine, N-butyl bis[2-(2-methoxyethoxycarbonyl)ethyl] amine, N-methyl bis(2-acetoxyethyl) amine, N-ethyl bis(2-acetoxyethyl) amine, N-methyl bis(2-pivaloyloxyethyl) amine, N-ethyl bis[2-(methoxycarbonyloxy)ethyl] amine, N-ethyl bis[2-(tert-butoxycarbonyloxy) ethyl] amine, tris(methoxycarbonylmethyl) amine, tris(ethoxycarbonylmethyl) amine, N-butyl bis(methoxycarbonylmethyl) amine, N-hexyl bis(methoxycarbonylmethyl) amine, and β-(diethylamino)-δ-valerolactone, although the compound is not limited thereto.

The basic compound of component (E) used may be one kind alone or a combination of two or more kinds.

The formulation amount of the basic compound of component (E) is preferably 0 to 3 parts by mass, particularly preferably 0.01 to 1 part by mass, based on 100 parts by mass of the silicone polymer compound of component (A), in view of sensitivity. Such a formulation amount prevents decrease in resolution and deterioration of a pattern.

[Component (F)]

The inventive photo-curable resin composition may further contain (F) a curing accelerator. (F) The curing accelerator is a compound that serves to accelerate the curing rate when a compound having an epoxy group is cured. Examples thereof include tertiary amines, salts thereof, and imidazole derivatives.

The curing accelerator may be a commercially available product, and illustrative examples thereof include 2MZ-A, 2MZ-OK, 2PHZ, 2P4BHZ, and 2P4MHZ-PW (all products are imidazole compounds) available from Shikoku Chemicals Corporation, and U-CAT3503N, U-CAT3502T (both products are block isocyanate compounds of dimethylamine), DBU, DBN, U-CATSA102, and U-CAT5002 (all products are bycyclic amidine compounds and salts thereof) available from San-Apro Ltd.

The formulation amount of the curing accelerator of component (F) is preferably 0 to 3 parts by mass, particularly preferably 0 to 1 part by mass, based on 100 parts by mass of the silicone polymer compound of component (A), in view of sensitivity. Such a formulation amount prevents decrease in resolution and deterioration of a pattern. When the component (F) is contained, the amount thereof is preferably 0.05 parts by mass or more based on 100 parts by mass of the silicone polymer compound of component (A).

The inventive photo-curable resin composition may further contain a solvent, if necessary. As the solvent, a solvent capable of dissolving the above components may be selected. Above all, an organic solvent, which is excellent in solubility to the above components, is preferable.

Examples of the oraganic solvent include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; these solvents may be used solely or in combination of two or more kinds. In particular, ethyl lactate, cyclohexanone, cyclopentanone, propylene glycol monomethyl ether acetate, and γ-butyrolactone, and a mixture thereof, which have the most excellent solubility to the photosensitive acid generator, are preferable.

The formulation amount of the solvent is preferably 50 to 2,000 parts by mass, more preferably 50 to 1,000 parts by mass, based on 100 parts by mass of the total amount of the components (A) to (D), in view of compatibility, viscosity, and coating properties of the photo-curable resin composition.

In addition to the above-mentioned components, the inventive photo-curable resin composition may further contain additives. The additives may include a surfactant which is commonly used to enhance coating properties. The surfactant is preferably a nonionic surfactant, for example, a fluorinated surfactant. Illustrative examples thereof include perfluoroalkyl polyoxyethylene ethanol, fluorinated alkyl ester, perfluoroalkylamine oxide, and a fluorine-containing organosiloxane compound.

The surfactant may be a commercially available product, and illustrative examples thereof include Flolade "FC-4430" (available from Sumitomo 3M Ltd.), Surflon "S-141" and "S-145" (both are available from Asahi Glass Co., Ltd.), Unidyne "DS-401", "DS-4031", and "DS-451" (all are available from Daikin Industries, Ltd.), Megafac "F-8151" (available from Dainippon Ink & Chemicals, Inc.), and "X-70-093" (available from Shin-Etsu Chemical Co., Ltd.). Among them, Flolade "FC-4430" (available from Sumitomo 3M Ltd.) and "X-70-093" (available from Shin-Etsu Chemical Co., Ltd.) are preferable.

The additives may include a light absorber which is commonly used to enhance light absorption of the photosensitive acid generator. Illustrative examples of the light absorber include diarylsulfoxide, diarylsulfone, 9,10-dimethylanthracene, and 9-fluorenone.

A method of preparing the photo-curable resin composition is not particularly limited. For example, the photo-curable resin composition can be prepared by mixing and stirring the above-mentioned components and filtering the mixture though a filter or the like.

The photo-curable dry film of the present invention will be now described.

The inventive photo-curable dry film includes a photo-curable resin layer composed of a film of the above photo-curable resin composition. The photo-curable resin layer has a thickness of 100 μm to 300 μm. The cured photo-curable resin layer preferably exhibits an elastic modulus of 0.1 to 2 GPa and a tensile strength of 1 to 80 MPa.

The inventive photo-curable dry film typically has a photo-curable resin layer, which is obtained by, for example, applying the photo-curable resin composition onto a supporting film and drying the same, sandwiched between the supporting film and a protective film.

A patterning process using this photo-curable dry film yields a cured film having a thickness of 100 μm to 300 This cured film is excellent in adhesiveness to a substrate, heat resistance, electric insulation property, reliability as an insulating top coat, and chemical resistance, and also useful for bonding substrates.

The photo-curable resin layer of the inventive photo-curable dry film may contains a solvent. Examples of the solvent include organic solvents as mentioned above. The content of the solvent is preferably 0 to 30 parts by mass, particularly preferably 0 to 15 mass parts by mass, based on 100 parts by mass of the photo-curable resin layer of the photo-curable dry film.

The supporting film used in the inventive photo-curable dry film may be a monolayer or a multilayer film having multiple polymer films being laminated. The material thereof may be a synthetic resin film such as polyethylene, polypropylene, polycarbonate, and polyethylene terephthalate. Among them, polyethylene terephthalate, which has appropriate flexibility, mechanical strength, and heat resistance, is preferable. These films may be subjected to various treatments such as corona treatment and coating treatment with a releasing agent. The film may be a commercially available product, and illustrative examples thereof include Cerapeel WZ (RX), Cerapeel BX8 (R) (both are available from Toray Advanced Film Co., Ltd.), E7302, E7304 (both are available from Toyobo Co., Ltd.), Purex G31, Purex G71T1 (both are available from Teijin DuPont Films Japan Ltd.), PET38×1-A3, PET38×1-V8, and PET38×1-X08 (all available from Nippa Co., Ltd.).

The protective film used in the inventive photo-curable dry film may be the same film as the supporting film mentioned above, but polyethylene terephthalate and polyethylene, which have appropriate flexibility, are preferable. The film may be a commercially available product, and illustrative examples thereof include, besides the polyethylene terephthalates already exemplified, polyethylene such as GF-8 (available from Tamapoly Co., Ltd.) and PE Film 0-Type (available from Nippa Co., Ltd.).

The thicknesses of the supporting film and the protective film are preferably 10 to 100 μm, particularly preferably 25 to 75 μm each, in view of stable production of the photo-curable dry film and the rolling habit around a roll axis, so-called curl-prevention.

A method of manufacturing the inventive photo-curable dry film will be now described. As to an apparatus for manufacturing the photo-curable dry film, a film coater for producing an adhesive product may be generally used. Illustrative examples of the film coater include a comma coater, a comma reverse coater, a multi coater, a die coater, a lip coater, a lip reverse coater, a direct gravure coater, an offset gravure coater, a 3-roll bottom reverse coater, and a 4-roll bottom reverse coater.

The dry film may be manufactured as follows. A supporting film is rolled-out from a roll-out axis of a film coater, and the inventive photo-curable resin composition is applied onto the supporting film with a prescribed thickness to form a photo-curable resin layer while the film passes through a coater head of the film coater. This film then passes through a hot-air circulating oven at a prescribed temperature for a prescribed period. The supporting film with the photo-curable resin layer thus dried thereon passes through a laminate roll together with a protective film rolled-out from another roll-out axis of the film coater under a prescribed pressure to bond the protective film to the photo-curable resin layer on the supporting film and then is rolled-up by a roll-up axis of the film coater. In this operation, the temperature of the hot-air circulating oven preferably ranges from 25 to 150° C., the period for passing through preferably ranges from 1 to 100 minutes, and the laminate roll pressure preferably ranges from 0.01 to 5 MPa.

The obtained photo-curable dry film from which the protective film is delaminated can be used by bonding to an electric and electronic part.

Next, a patterning process using the photo-curable dry film manufactured as above will be described.

The patterning process using the photo-curable dry film may include the steps of:

(i) forming a photo-curable resin layer on a substrate with the photo-curable dry film;

(ii) performing exposure to light having a wavelength of 190 to 500 nm via a photomask; and (iii) performing heat treatment after the exposure (post-exposure baking, PEB) and development with a developer.

Each step will be described in detail below.

In the step (i), the protective film is delaminated from the photo-curable dry film, and the photo-curable dry film from which the protective film is delaminated is bonded to a substrate with a film-bonding apparatus. A photo-curable resin layer is thereby formed.

Examples of the substrate include a silicon wafer, a silicon wafer for through electrode, a silicon wafer thinned by back-surface polishing, a plastic or ceramic substrate, and a substrate wholly or partially coated with metal such as Ni and Au by an ion-spattering method, a plating method, or other methods.

The film-bonding apparatus is preferably a vacuum laminator. The protective film is delaminated from the photo-curable dry film, and the photo-curable resin layer thereby exposed is bonded to a substrate on a table at a prescribed temperature by a bonding roll under a prescribed pressure in a vacuum chamber with a prescribed degree of vacuum. The temperature of the table preferably ranges from 50 to 120° C., the pressure of the bonding roll preferably ranges from 0 to 5.0 MPa, and the degree of vacuum in the vacuum chamber preferably ranges from 50 to 500 Pa.

To obtain a photo-curable resin layer with a required thickness, the films may be bonded multiple times, as needed.

To effectively carry out the photo-curing reaction of the photo-curable resin layer and improve adhesion between the photo-curable resin layer and the substrate, pre-baking may be performed as needed. The pre-baking may be performed, for example, at 40 to 140° C. for 1 minute to 1 hour approximately.

The supporting film of the photo-curable dry film is removed before pre-baking or PEB by, for example, mechanically peeling.

Then, in the step (ii), exposure to light having a wavelength of 190 to 500 nm is performed via a photomask. The photomask may be obtained by engraving a desired pattern. The photomask is preferably made of a material that can shield the light having a wavelength of 190 to 500 nm. For example, chromium and the like are preferably used, although it is not limited thereto.

Examples of the light having a wavelength of 190 to 500 nm include lights having various wavelengths generated from, for example, a radiation-generating apparatus, including UV light such as g-beam, h-beam and i-beam and far ultraviolet light (248 nm and 193 nm). The wavelength preferably ranges from 248 to 436 nm. The exposure dose preferably ranges from 10 to 5,000 mJ/cm$^2$.

Then, in the step (iii), PEB is first performed to enhance the development sensitivity. The PEB is preferably performed at 40 to 140° C. for 0.5 to 30 minutes.

After the PEB, development is performed with a developer. The developer is preferably an organic solvent used as a solvent, which may include alcohols such as isopropyl alcohol (IPA), ketones such as cyclohexanone, glycols such as propylene glycol monomethyl ether, and esters such as propylene glycol monomethyl ether acetate, and may be a solvent used in the photo-curable resin composition. The development may be performed by a usual method, for example, by soaking a substrate having a formed pattern into a developer. Then, if necessary, washing, rinsing, drying, and so forth may be performed to obtain a film of the photo-curable resin layer having an intended pattern. This development causes an unexposed part to dissolve and a part crosslinked by the exposure to remain as a pattern.

If a pattern is not required to be formed, for example, if a uniform film is formed, the film may be formed in the same manner as above except that the exposure to light having a wavelength of 190 to 500 nm is performed without the photomask.

After the step (iii), the method preferably includes the step (iv) of post-curing the obtained pattern (or film) with an oven or a hot plate at 100 to 250° C., preferably 150 to 220°

C. When the post-curing temperature ranges from 100 to 250° C., the crosslinking density of the photo-curable resin layer is increased, and remaining volatile components can be removed. Thus, this temperature range is preferable in view of adhesiveness to a substrate, heat resistance, strength, and electronic characteristics. The post-curing time can ranges from 10 minutes to 10 hours.

A cured film obtained by post-curing a pattern (or a film) that has been formed by using the photo-curable dry film or the photo-curable resin composition of the present invention is excellent in heat resistance, flexibility, electric insulation property, mechanical characteristics, and adhesiveness to a substrate, and thus suitably used as a top coat to protect electric and electronic parts such as a semiconductor device.

In particular, since this top coat has heat resistance, chemical resistance, insulation property, and flexibility, this top coat is useful to an insulating film for a semiconductor device including redistribution use, an insulating film for a multilayer printed substrate, a solder mask, an insulating film for through electrode of TSV, and a cover lay film, as well as useful for bonding substrates.

In the case that the photo-curable resin composition or the photo-curable dry film of the present invention is used for bonding substrates, the photo-curable resin layer may be formed on one substrate as in the step (i), and the other substrate may be bonded thereto.

EXAMPLES

Hereinafter, the present invention will be specifically described with reference to examples and comparative example, but the present invention is not limited to the following examples. In the following examples, the term "part" indicates part by mass. The structural formulae of compounds (M-1) to (M-6) used in synthesis examples of the present invention are shown below.

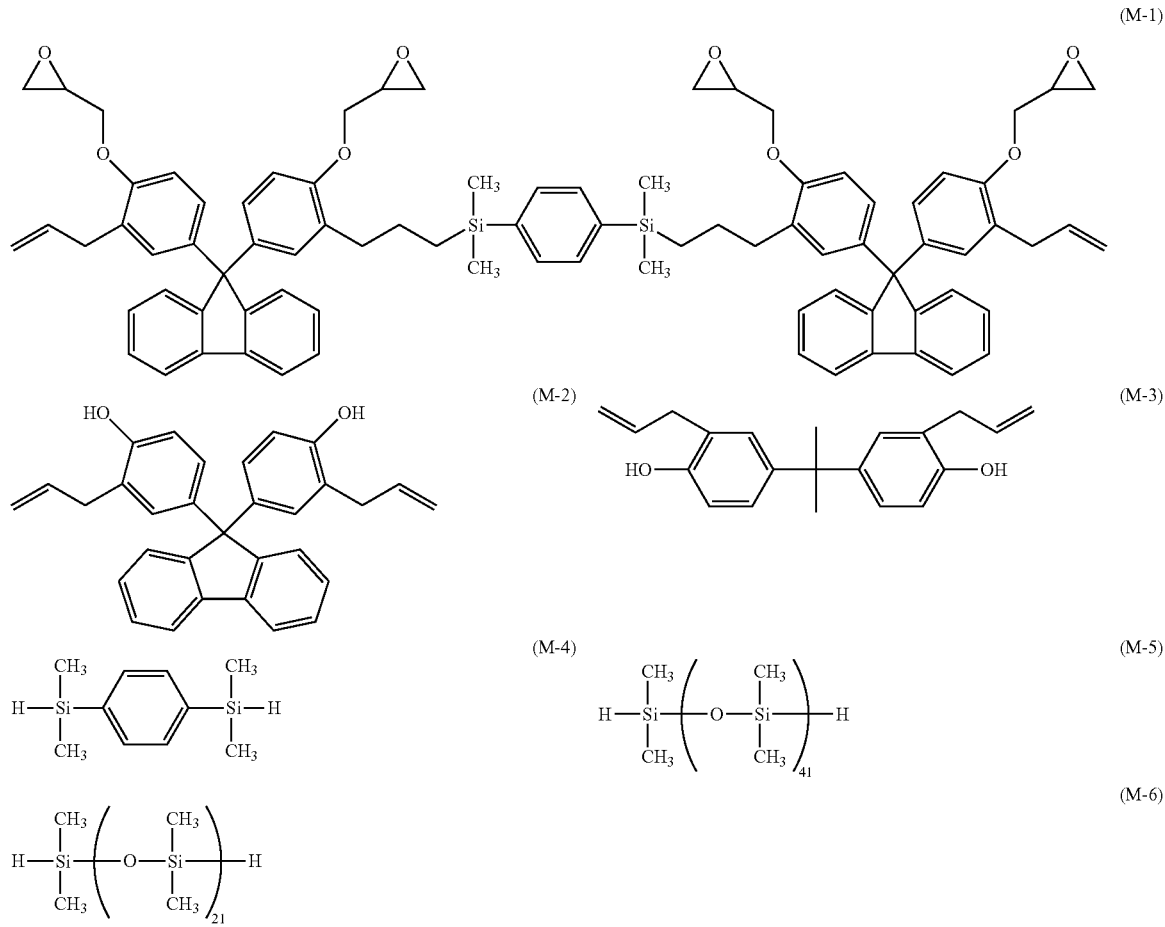

Synthesis Example 1

A 1 L separable flask equipped with a nitrogen gas introducing tube, a thermometer, a Dimroth condenser, and a dropping funnel was charged with 215 g (0.5 mol) of an unsaturated group-containing compound shown by the formula (M-2), 500 g of toluene, and 0.10 g of a carbon carried platinum catalyst (5 mass %). Then, 48.5 g (0.25 mol) of 1,4-bis(dimethylsilyl)benzene shown by the formula (M-4) was gradually added dropwise thereto at 75° C. This dropwise addition took 10 minutes. After completion of dropwise addition, the mixture was aged at 75° C. for 10 hours. After completion of aging, gas chromatography analysis was performed and showed that the amount of the 1,4-bis(dimethylsilyl)benzene was reduced to 2% or less. The obtained solution was filtered through a filter under pressure to remove the platinum catalyst. The obtained solution was then concentrated with a rotary evaporator at 80° C. under a reduced pressure of 0.6 kPa to obtain 250 g of a brown solid. The obtained brown solid was analyzed by infrared absorption spectrometry and ¹H nuclear magnetic resonance spectrometry, resulting in a silphenylene compound having fluorene structures with an allyl group and phenolic hydroxyl groups at both terminals, as shown below.

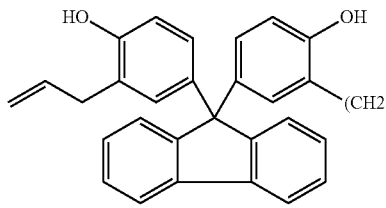
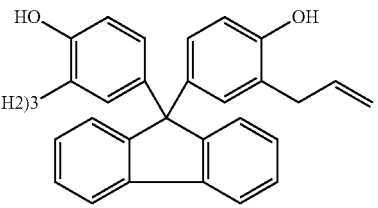

Subsequently, a 1 L separable flask equipped with a nitrogen gas introducing tube, a thermometer, a Dimroth condenser, and a dropping funnel was charged with 210.8 g (0.2 mol) of the resulting silphenylene compound having fluorene structures with an allyl group and phenolic hydroxyl groups at both terminals. This compound was dissolved in 278 g (3.0 mol) of epichlorohydrin, mixed with 0.44 g of tetramethylammonium chloride, and stirred at 100° C. for 5 hours. Then, 44 g of a 40% sodium hydroxide aqueous solution was added dropwise thereto over 3 hours at 70° C. under reduced pressure (20 kPa). During dropwise addition, produced water was removed from the system by azeotropic distillation with the epichlorohydrin, and the evaporated epichlorohydrin was restored to the system. After completion of dropwise addition, the reaction was further continued for 30 minutes. Thereafter, the formed salt was removed by filtration, the solution was washed with water, and the epichlorohydrin was distilled off to obtain 180 g of a brown solid. The obtained brown solid was analyzed by infrared absorption spectrometry and ¹H nuclear magnetic resonance spectrometry, resulting in a silphenylene-skeleton-containing compound (M-1) having fluorene structures with an allyl group and epoxy groups at both terminals.

Synthesis Example 2

A 5 L flask equipped with a stirrer, thermometer, nitrogen purge system, and reflux condenser was charged with 256.0 g of compound (M-1) and 53.8 g of compound (M-2). These compounds were dissolved in 1300 g of toluene and heated at 60° C. Thereafter, 1.6 g of carbon carried platinum catalyst (5 mass %) was added thereto, and a mixture of 53.5 g of compound (M-4) and 151.0 g of compound (M-5) was added dropwise to the flask over 1 hour. At this time, the temperature inside the flask increased to 78° C. After completion of dropwise addition, the solution was aged at 90° C. for 5 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 330 g of cyclopentanone was added to obtain a silicone polymer compound solution (A-1) containing the cyclopentanone as the main solvent with a solid concentration of 60 mass %. The molecular weight of the silicone polymer compound in this solution was measured by GPC, consequently finding a weight average molecular weight of 45,000 in terms of polystyrene. Calculation of the mole ratio of the raw materials showed that this silicone polymer compound corresponds to the component (A) in which a in the general formula (1) is 0.615 and b in the general formula (2) is 0.385.

Synthesis Example 3

A 5 L flask equipped with a stirrer, thermometer, nitrogen purge system, and reflux condenser was charged with 170.6 g of compound (M-1) and 35.9 g of compound (M-2). These compounds were dissolved in 1300 g of toluene and heated at 60° C. Thereafter, 1.6 g of carbon carried platinum catalyst (5 mass %) was added thereto, and a mixture of 6.5 g of compound (M-4) and 296.0 g of compound (M-6) was added dropwise to the flask over 1 hour. At this time, the temperature inside the flask increased to 75° C. After completion of dropwise addition, the solution was aged at 90° C. for 3 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 320 g of cyclopentanone was added to obtain a silicone polymer compound solution (A-2) containing the cyclopentanone as the main solvent with a solid concentration of 60 mass %. The molecular weight of the silicone polymer compound in this solution was measured by GPC, consequently finding a weight average molecular weight of 32,000 in terms of polystyrene. Calculation of the mole ratio of the raw materials showed that this silicone polymer compound corresponds to the component (A) in which a in the general formula (1) is 0.615 and b in the general formula (2) is 0.385.

Synthesis Example 4

A 5 L flask equipped with a stirrer, thermometer, nitrogen purge system, and reflux condenser was charged with 93.3 g of compound (M-1) and 26.9 g of compound (M-2). These compounds were dissolved in 1300 g of toluene and heated at 60° C. Thereafter, 1.6 g of carbon carried platinum catalyst (5 mass %) was added thereto, and 409.0 g of compound (M-5) was added dropwise to the flask over 1 hour. At this time, the temperature inside the flask increased to 76° C. After completion of dropwise addition, the solution was aged at 90° C. for 18 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 340 g of cyclopentanone was added to obtain a silicone polymer compound solution (A-3) containing the cyclopentanone as the main solvent with a solid concentration of 60 mass %. The molecular weight of the silicone polymer compound in this solution was measured by GPC, consequently finding a weight average molecular weight of 250,000 in terms of polystyrene. Calculation of the mole ratio of the raw materials showed that this silicone polymer compound corresponds to the component (A) in which a in the general formula (1) is 0.538 and b in the general formula (2) is 0.462.

Synthesis Example 5

A 5 L flask equipped with a stirrer, thermometer, nitrogen purge system, and reflux condenser was charged with 128.0 g of compound (M-1) and 41.1 g of compound (M-3). These compounds were dissolved in 1300 g of toluene and heated at 60° C. Thereafter, 1.6 g of carbon carried platinum catalyst (5 mass %) was added thereto, and a mixture of 19.5 g of compound (M-4) and 402.7 g of compound (M-5) was added dropwise to the flask over 1 hour. At this time, the temperature inside the flask increased to 74° C. After completion of dropwise addition, the solution was aged at 90° C. for 8 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 380 g of cyclopentanone was added to obtain a silicone polymer compound solution (A-4) containing the cyclopentanone as the main solvent with a solid concentration of 60 mass %. The molecular weight of the silicone polymer compound in this solution was measured by GPC, consequently finding a weight average molecular weight of 75,000 in terms of polystyrene. Calculation of the mole ratio of the raw materials showed that this silicone polymer compound corresponds to the component (A) in which a in the general formula (1) is 0.429 and b in the general formula (2) is 0.571.

Synthesis Example 6

A 5 L flask equipped with a stirrer, thermometer, nitrogen purge system, and reflux condenser was charged with 64.0 g of compound (M-1) and 96.9 g of compound (M-3). These compounds were dissolved in 1300 g of toluene and heated at 60° C. Thereafter, 1.6 g of carbon carried platinum catalyst (5 mass %) was added thereto, and a mixture of 34.0 g of compound (M-4) and 302.0 g of compound (M-5) was added dropwise to the flask over 1 hour. At this time, the temperature inside the flask increased to 79° C. After completion of dropwise addition, the solution was aged at 90° C. for 5 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 320 g of cyclopentanone was added to obtain a silicone polymer compound solution (A-5) containing the cyclopentanone as the main solvent with a solid concentration of 60 mass %. The molecular weight of the silicone polymer compound in this solution was measured by GPC, consequently finding a weight average molecular weight of 43,000 in terms of polystyrene. Calculation of the mole ratio of the raw materials showed that this silicone polymer compound corresponds to the component (A) in which a in the general formula (1) is 0.182 and b in the general formula (2) is 0.818.

Synthesis Example 7

A 5 L flask equipped with a stirrer, thermometer, nitrogen purge system, and reflux condenser was charged with 352.0 g of compound (M-1). The compound was dissolved in 1300 g of toluene and heated at 60° C. Thereafter, 1.6 g of carbon carried platinum catalyst (5 mass %) was added thereto, and a mixture of 34.0 g of compound (M-4) and 302.0 g of compound (M-5) was added dropwise to the flask over 1 hour. At this time, the temperature inside the flask increased to 78° C. After completion of dropwise addition, the solution was aged at 90° C. for 5 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 410 g of cyclopentanone was added to obtain a silicone polymer compound solution (B-1) containing the cyclopentanone as the main solvent with a solid concentration of 60 mass %. The molecular weight of the silicone polymer compound in this solution was measured by GPC, consequently finding a weight average molecular weight of 45,000 in terms of polystyrene.

Examples and Comparative Example

According to the formulation amount shown in Table 1, the silicone polymer compound solution (component (A)), a photosensitive acid generator (component (B)), crosslinking agents (components (C) and (D)), a basic compound (component (E)), other additives, and a solvent were mixed, stirred, and dissolved at room temperature. The solution was filtered through a 1.0 μm filter made of Teflon (registered trade mark) for microfiltration to obtain photo-curable resin compositions of Examples 1 to 10 and Comparative Example 1.

By using a die coater as a film coater and a polyethylene terephthalate film (with a thickness of 50 μm) as a supporting film, photo-curable resin compositions of Examples 1 to 10 and Comparative Example 1 were each applied onto the supporting film. The film was caused to pass through a hot-air circulating oven (length of 4 m) at 100° C. over 8 minutes to form a photo-curable resin layer on the supporting film. A polyethylene film (with a thickness of 50 μm) was then laminated as a protective film on the photo-curable resin layer with a laminate roll under a pressure of 1 MPa to manufacture a photo-curable dry film. Table 1 shows the thickness of the photo-curable dry film. The thickness was measured with a thickness-measuring apparatus of contact type.

The protective film of the individual photo-curable dry films in Examples 1 to 10 and Comparative example 1 was delaminated. The photo-curable resin layer on the supporting film was then bonded to a silicon substrate by a vacuum laminator TEAM-100RF (manufactured by Takatori Corp.) with a vacuum degree in the vacuum chamber of 80 Pa. The temperature condition was 110° C. After the pressure was resumed to normal pressure, the substrate was taken out from the vacuum laminator, and the supporting film was delaminated. Subsequently, pre-baking was carried out with a hot plate at 130° C. for 5 minutes to enhance adhesion to the substrate. The obtained photo-curable resin layer was exposed to light via a mask, under exposure conditions of 405 nm and 1500 mJ/cm$^2$, with an exposure apparatus, a contact aligner, to form a pattern. After the photo-exposure, PEB was performed with a hot plate at 130° C. for 5 minutes, and the substrate was cooled and subjected to spray development with propylene glycol monomethyl ether acetate (PGMEA) for 600 seconds.

The photo-curable resin layer having the pattern thus formed on the substrate was post-cured with an oven at 180° C. for 2 hours while purging with nitrogen. The resolution of the hole pattern with respect to the film thickness was then measured with a scanning electron microscope (SEM). The elastic modulus at 25° C. of the cured photo-curable resin layer was measured with a dynamic viscoelasticity measuring apparatus (DMA). The tensile strength was measured in accordance with JIS K 7127. The result is given in Table 1.

The photosensitive acid generators used in the examples of the present invention, shown in Table 1, are as follows.

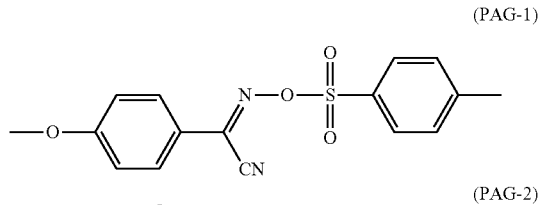
(PAG-1)

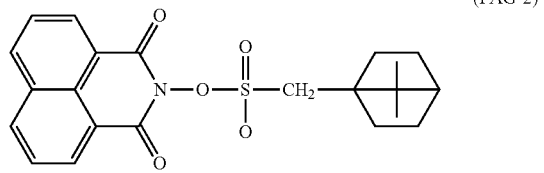
(PAG-2)

The crosslinking agent (Component (C)) used in the examples of the present invention, shown in Table 1, is as follows.

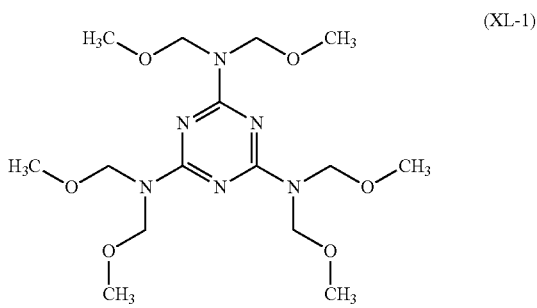
(XL-1)

The polyhydric phenol compounds (Component (D)) used in the examples of the present invention, shown in Table 1, are as follows.

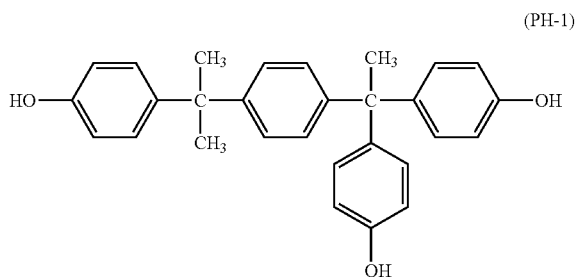
(PH-1)

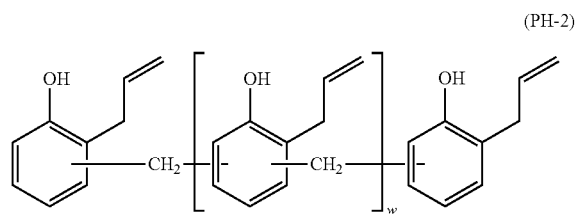
(PH-2)

MEH-8000H (Product name, available from Meiwa Plastic Industries, Ltd.)

The basic compound shown in Table 1 is as follows.

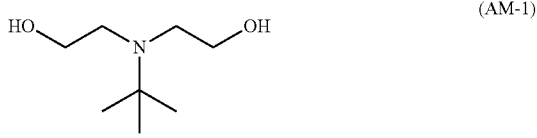
(AM-1)

U-CAT5002 shown in Table 1 is a curing accelerator available from San-Apro Ltd.

In addition, the mole ratio (epoxy group/(epoxy group+ phenolic hydroxyl group)) between the epoxy groups and the phenolic hydroxyl groups in each polymer compound in the solutions obtained in Synthesis Examples 1 to 7 was calculated. The calculation result is given in Table 2.

TABLE 1

| | Components of photo-curable resin composition | | | | | | Thickness of photo-curable resin layer (μm) | Resolution of hole pattern | Elastic modulus (GPs) | Tensile strength (MPa) |
|---|---|---|---|---|---|---|---|---|---|---|
| | Silicone polymer compound | Photosensitive acid generator | Cross-linking agent | Cross-linking agent | Basic compound | Additive | Solvent | | | | |
| Example 1 | A-1 100 parts | PAG-1 2 parts | XL-1 10 parts | PH-1 5 parts | | | cyclopentanone 55 parts | 150 | 100 | 0.5 | 25 |
| Example 2 | A-2 100 parts | PAG-1 3 parts | XL-1 10 parts | PH-1 5 parts | | U-Cat 5002 0.02 part | cyclopentanone 55 parts | 280 | 250 | 0.7 | 30 |
| Example 3 | A-3 100 parts | PAG-1 2 parts | XL-1 5 parts | PH-1 12 parts | | | cyclopentanone 55 parts | 120 | 70 | 0.9 | 35 |
| Example 4 | A-4 100 parts | PAG-1 2 parts | XL-1 10 parts | PH-1 5 parts | | | cyclopentanone 55 parts | 210 | 170 | 0.6 | 20 |
| Example 5 | A-5 100 parts | PAG-1 2 parts | XL-1 10 parts | PH-2 5 parts | | | cyclopentanone 55 parts | 250 | 220 | 0.6 | 20 |
| Example 6 | A-1 100 parts | PAG-2 2 parts | XL-1 10 parts | PH-1 5 parts | | | cyclopentanone 55 parts | 150 | 110 | 0.5 | 30 |
| Example 7 | A-3 100 parts | PAG-1 2 parts | XL-1 10 parts | PH-1 5 parts | AM-1 0.2 part | | cyclopentanone 55 parts | 240 | 200 | 0.5 | 20 |
| Example 8 | A-4 100 parts | PAG-1 3 parts | XL-1 5 parts | PH-1 5 parts | AM-1 0.4 part | | cyclopentanone 55 parts | 200 | 140 | 0.6 | 20 |
| Example 9 | A-3 100 parts | PAG-1 0.5 part | XL-1 10 parts | PH-1 15 parts | | | cyclopentanone 55 parts | 100 | 50 | 1.0 | 35 |
| Example 10 | A-3 100 parts | PAG-1 4 parts | XL-1 10 parts | PH-1 5 parts | | | cyclopentanone 55 parts | 200 | 150 | 0.5 | 20 |
| Comparative Example 1 | B-1 100 parts | PAG-1 2 parts | XL-1 10 parts | PH-1 5 parts | | | cyclopentanone 55 parts | 150 | — | — | — |

TABLE 2

| Silicone polymer compound solution | Mole ratio |
|---|---|
| A-1 | 0.762 |
| A-2 | 0.762 |
| A-3 | 0.7 |
| A-4 | 0.429 |
| A-5 | 0.308 |
| B-1 | 1 |

As shown in Tables 1 and 2, the photo-curable dry films manufactured with the photo-curable resin composition containing the components (A) to (D) (Examples 1 to 10) could facilitate thick and fine patterning when the film was used in patterning. On the other hand, Comparative example 1, in which the component (A) does not satisfy the requirements of the present invention, failed to form a pattern.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A photo-curable resin composition, comprising:
(A) a silicone polymer compound having an epoxy group-containing repeating unit shown by the following general formula (1) and a phenolic hydroxyl group-containing repeating unit shown by the following general formula (2), wherein the silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2);

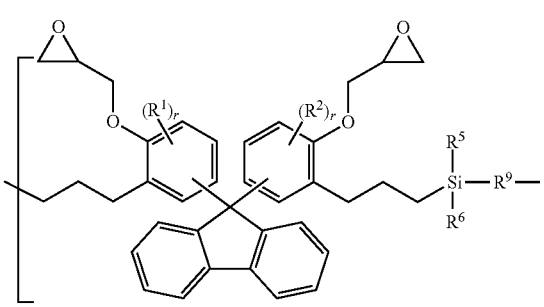

(1)

-continued

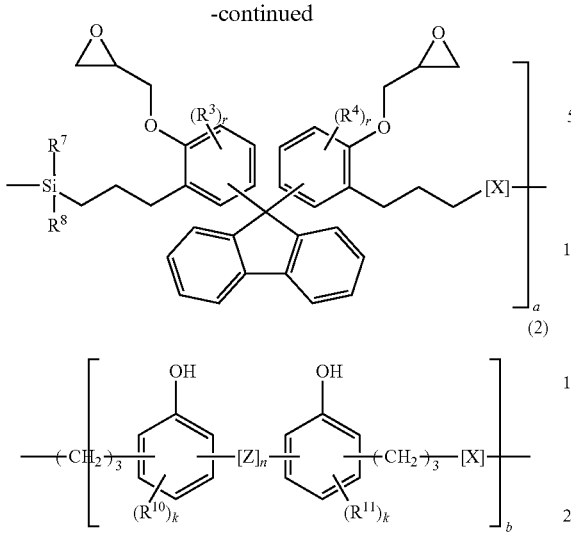

(2)

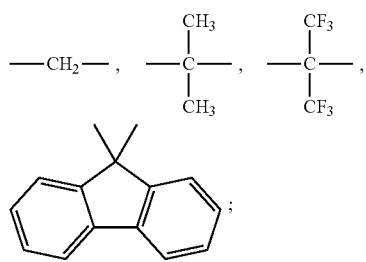

wherein a and b represent a positive number and $0.05 \leq a \leq 0.8$ and $0.2 \leq b \leq 0.95$, with the proviso that $a+b=1$; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of and X represents a divalent organic group shown by the following formula (3) or the following general formula (4),

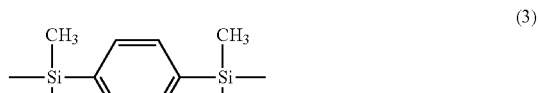

(3)

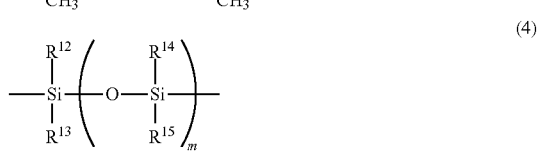

(4)

wherein $R^{12}$, $R^{13}$, $R^{14}$, and $R^{15}$ may be the same or different and represent a monovalent hydrocarbon group having 1 to 10 carbon atoms; and m represents a positive number of 1 to 100;

(B) a photosensitive acid generator capable of generating an acid by decomposition with light having a wavelength of 190 to 500 nm;

(C) one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group; and (D) one or two or more compounds selected from polyhydric phenols having 3 or more hydroxyl groups.

2. The photo-curable resin composition according to claim 1, further comprising (E) a basic compound.

3. A photo-curable dry film comprising a photo-curable resin layer composed of a film of the photo-curable resin composition according to claim 1, the photo-curable resin layer having a thickness of 100 μm to 300 μm.

4. A photo-curable dry film comprising a photo-curable resin layer composed of a film of the photo-curable resin composition according to claim 2, the photo-curable resin layer having a thickness of 100 μm to 300 μm.

5. The photo-curable resin composition according to claim 1, wherein a and b represent $0.2 \leq a \leq 0.8$ and $0.2 \leq b \leq 0.8$.

* * * * *